United States Patent
Crocherie et al.

(10) Patent No.: US 12,471,398 B2
(45) Date of Patent: Nov. 11, 2025

(54) LIGHT SENSOR INCLUDING A DIFFRACTION GRATING CONFIGURED TO DIFFRACT RECEIVED LIGHT RAYS FOR ABSORPTION IN A PHOTOELECTRIC MATERIAL LAYER

(71) Applicant: STMicroelectronics (Crolles 2) SAS, Crolles (FR)

(72) Inventors: Axel Crocherie, Grenoble (FR); Sandrine Villenave, Grenoble (FR); Felix Bardonnet, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 585 days.

(21) Appl. No.: 17/840,342

(22) Filed: Jun. 14, 2022

(65) Prior Publication Data
US 2022/0406828 A1    Dec. 22, 2022

(30) Foreign Application Priority Data
Jun. 18, 2021 (FR) ..................... 2106512

(51) Int. Cl.
H10F 39/00 (2025.01)
G02B 27/42 (2006.01)

(52) U.S. Cl.
CPC ....... H10F 39/806 (2025.01); G02B 27/4205 (2013.01)

(58) Field of Classification Search
CPC ........... H01L 27/14625; H01L 27/1462; H01L 27/14665; G02B 27/4205; H01F 39/806; H01F 39/805; H01F 39/191
See application file for complete search history.

(56) References Cited

U.S. PATENT DOCUMENTS

| | | | |
|---|---|---|---|
| 2010/0245638 A1* | 9/2010 | Ota | H01L 27/1464 348/E5.091 |
| 2013/0032914 A1 | 2/2013 | Iwasaki | |
| 2013/0099343 A1* | 4/2013 | Toshikiyo | H01L 27/14629 257/432 |
| 2013/0234006 A1* | 9/2013 | Ogawa | H10F 77/413 250/208.2 |
| 2013/0334640 A1* | 12/2013 | Lee | H10F 39/024 257/432 |
| 2016/0126275 A1 | 5/2016 | Kurokawa | |
| 2020/0076999 A1 | 3/2020 | Akiyama et al. | |
| 2021/0088378 A1 | 3/2021 | Monfray et al. | |
| 2021/0091135 A1* | 3/2021 | Yokogawa | H01L 27/14612 |

FOREIGN PATENT DOCUMENTS

| | | |
|---|---|---|
| CN | 106796326 A | 5/2017 |
| CN | 112563296 A | 3/2021 |
| CN | 217983348 U | 12/2022 |
| WO | 2018211971 A1 | 11/2018 |

OTHER PUBLICATIONS

INPI Search Report and Written Opinion for priority application, FR 2106512, report dated Mar. 7, 2022, 8 pgs.
CN First Office Action and Search Report for counterpart CN Appl. No. 202210690867.9, report dated May 1, 2025, 9 pgs.

* cited by examiner

*Primary Examiner* — Jennifer D Bennett
(74) *Attorney, Agent, or Firm* — Crowe & Dunlevy LLC

(57) ABSTRACT

The present disclosure relates to an image sensor comprising a first layer of photoelectric material and a diffraction grating located between said first layer and the face of the sensor configured to receive light rays.

18 Claims, 2 Drawing Sheets

LIGHT SENSOR INCLUDING A DIFFRACTION GRATING CONFIGURED TO DIFFRACT RECEIVED LIGHT RAYS FOR ABSORPTION IN A PHOTOELECTRIC MATERIAL LAYER

PRIORITY CLAIM

This application claims the priority benefit of French Application for Pat. No. 2106512, filed on Jun. 18, 2021, the content of which is hereby incorporated by reference in its entirety to the maximum extent allowable by law.

TECHNICAL FIELD

The present disclosure relates to optoelectronic devices in general and, more preferably, to light sensors.

BACKGROUND

Light sensors are optoelectronic devices capable of generating charges upon receiving light rays. Light sensors preferably comprise a layer or region of a photoelectric material (i.e., a material that absorbs photons and generates electrical charges).

The light rays reaching the layer of photoelectric material are not completely absorbed by the layer. Part of the light rays is reflected on said layer and part of the light rays passes through said layer. As a result, part of the light rays received by the light sensor does not generate charges. The light sensors are thus less efficient.

There is a need in the art to addresses all or some of the drawbacks of known light sensors.

SUMMARY

One embodiment provides an image sensor comprising a first layer of photoelectric material and a diffraction grating located between said first layer and the face of the sensor configured to receive light rays.

According to one embodiment, the diffraction grating has a periodic shape.

According to one embodiment, the diffraction grating comprises a plurality of first blocks.

According to one embodiment, the first blocks are identical to each other.

According to one embodiment, the diffraction grating comprises second blocks that have at least one dimension different from that of the first blocks.

According to one embodiment, the diffraction grating and the layer are separated by a first electrode.

According to one embodiment, the first electrode is a second conductive layer that covers the first layer entirely.

According to one embodiment, the sensor comprises second electrodes in contact with the first layer on the side opposite the diffraction grating.

According to one embodiment, the sensor comprises a substrate on which the first layer rests.

According to one embodiment, each second electrode comprises a conductive pad located in the substrate.

According to one embodiment, each second electrode comprises a third conductive layer resting on one of the conductive pads and partially rests on the substrate.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
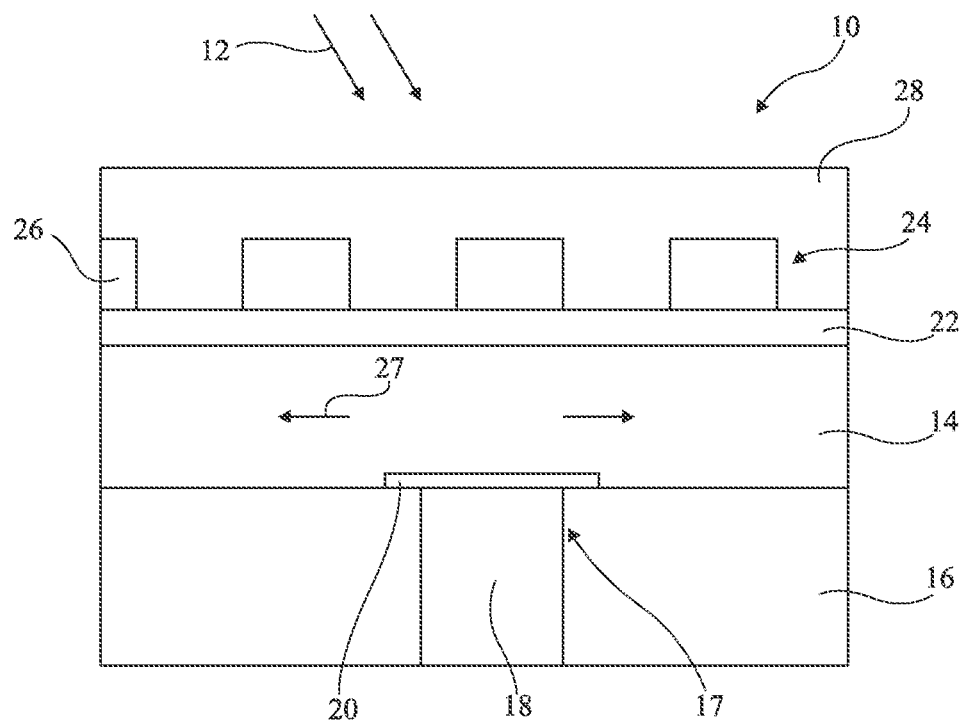
FIG. 1 shows one embodiment of a light sensor.

FIG. 1 shows one embodiment of a light sensor 10. The sensor 10 is configured to receive light 12 rays, or radiation, from a front, or top, side. The sensor 10 is configured to generate electrical charges upon receiving light rays that have a wavelength $\lambda$ equal to an operating wavelength of the sensor 10 (i.e., equal to a value $\lambda 0$, or in a wavelength range between $\lambda 01$ and $\lambda 02$). The values $\lambda 0$, $\lambda 01$, and $\lambda 02$ are between 250 nm and 1500 nm, for example, which corresponds to radiation that can range from ultraviolet (UV) through visible to near infrared radiation (NIR).

The sensor 10 comprises a layer 14 of a photoelectric material. The photoelectric material is configured to generate charges when light rays with a wavelength equal to the operating wavelength are in contact with the photoelectric material. The longer the time this light is in contact with the photoelectric material, the greater the number of charges generated. The layer is preferably a planar layer (i.e., the layer 14 preferably comprises a bottom side and a top side that are parallel to each other).

The layer 14 is a quantum film, a quantum well, a quantum dot layer, a III-V material, silicon, InGaS, for example, or other photoelectric material. The choice of material depends on the operating wavelength of the sensor, for example. Preferably, the top side and bottom side of the layer 14 are parallel. A type III-V material means an alloy of at least one group III material (Boron, Aluminum, Gallium, Indium, Titanium) and at least one group V material (Nitrogen, Phosphorus, Arsenic, Antimony, Bismuth, Moscovium).

The layer 14 rests on a support 16. The support 16 is a semiconductor substrate, for example, such as a semiconductor-on-insulator (SOI) substrate. In another example, the support 16 is a stack of insulating layers comprising conductive tracks and vias.

The sensor 10 comprises at least one bottom electrode 17, preferably a plurality of bottom electrodes 17. A single electrode 17 is shown in FIG. 1. The bottom electrode 17 corresponds to a pixel of the light sensor, for example. The electrode 17 comprises a conductive region 18, made of metal for example, such as copper, located in the substrate 16. The region 18 is preferably flush with the top side of the holder 16. The electrode 17 comprises a conductive layer 20, for example, of metal, for example, such as titanium nitride. The conductive layer 20 preferably covers the region 18 entirely and at least partially covers the layer 16, for example. The layer 20 is preferably separated from the layers 20 of neighboring electrodes, by a portion of the layer 14, for example, or by a portion of insulating material. The layer 20 is thus in contact with the region 18, on one side, and with the layer 14 on the other side.

The layer 20 connects the layer 14 electrically to the region 18. Thus, charges generated in the layer 14 upon absorption of light rays are transmitted through the electrode 17 to a data processing circuit, for example.

The sensor 10 comprises a top electrode 22. The electrode 22 is preferably a conductive layer, of a metal, for example. The electrode 22 covers the entire layer 14, for example. The electrode 22 is common to all pixels of the sensor 10, for example. The electrode 22 is at least partially transparent. Preferably, electrode 22 is transparent at wavelengths λ equal to an operating wavelength. Transparent in this context means that electrode 22 is configured to pass at least 75% of radiation having a wavelength λ equal to an operating wavelength. The more transparent the top electrode 22 is (i.e., the higher the proportion of radiation that is allowed to pass), the greater the efficiency of the sensor will be.

The sensor 10 further comprises a diffraction grating 24. The diffraction grating 24 is located on the electrode 22, for example. In other words, the grating 24 is separated from the layer 14 by the electrode 22, for example. The grating 24 is located on the front side in relation to the layer 14. In other words, the grating 24 is located between the layer 14 and the front side. The grating 24 is therefore located between the layer 14 and the face configured to receive the light rays 12. After passing through the diffraction grating, the rays 12 become guided rays 27. The diffraction grating will thus enable the coupling of the light in the layer, or the guide, 14.

The grating 24 is covered by a layer 28, preferably a protective insulating layer. The material of layer 28 is preferably transparent at wavelengths λ, equal to an operating wavelength.

The grating 24 comprises blocks 26, preferably at least three blocks 26. The blocks 26 are separated from each other by portions of the layer 28. The blocks 26 rest on the electrode 22, for example. The blocks 26 have a rectangular parallelepiped shape, for example. The blocks 20 may have another shape, chosen to improve detection efficiency, for example. Circular shapes improve the polarization symmetry of the sensor, for example. Elliptical shapes favor one polarization over another. The shape of the blocks 26 thus depends on the intended application.

The sensor 10 is configured so that at least part, preferably most of the diffracted light rays 27 having a wavelength substantially equal to an operating wavelength have a direction in the layer 14 that is substantially parallel to the top side or bottom side of the layer 14. In other words, the sensor 10 is configured so that at least part, preferably most of the light rays 27 having a wavelength equal to an operating wavelength, after diffraction by the diffraction grating, move in a plane entirely contained by the layer 14. Thus, the time during which the radiation is in contact with the layer 14 is increased. In other words, the duration during which charges are generated is increased. This makes the light sensor more sensitive.

The materials of the blocks 26 and the layers 14 and 28, specifically their optical indices, the dimensions of the grating and the dimensions of the layer 14, are chosen so as to optimize, for a given wavelength for example, the amount of diffracted light rays lying in a plane entirely contained within the layer 14. An example of determining these criteria is described in more detail in connection with FIG. 3.

In the example shown in FIG. 1, the blocks 26 are identical. In other words, the blocks 26 all have the same dimensions in this example. In addition, the distance between neighboring blocks 26 is substantially the same. Preferably, the period of the grating 24 (i.e., the sum of the width of a block 26 and the distance between two neighboring blocks) is substantially equal to the operating wavelength in the material of the layer 14. Preferably, the blocks 26 are made of a material that does not absorb radiation at the operating wavelength.

In a variant, the blocks 26 located opposite a pixel all have the same dimensions and the distance between neighboring blocks 26 located opposite said pixel is substantially the same. In addition, the dimensions of the grating 24 (i.e., the dimensions of the blocks 26 and the distance between two neighboring blocks 26 located opposite another pixel) may be different. Thus, one pixel may be configured to be more sensitive to one wavelength and a neighboring pixel may be configured to be sensitive to another wavelength.

Similarly, a pixel can be configured to be more sensitive at one angle of incidence and a neighboring pixel can be configured to be more sensitive at another angle of incidence. This allows the device to be optimized according to the angle of incidence of the source, with the pixels not receiving radiation from the same source at the same angle of incidence. The grating period will therefore also be adapted according to the angle of incidence targeted for each pixel.

Figure 2:
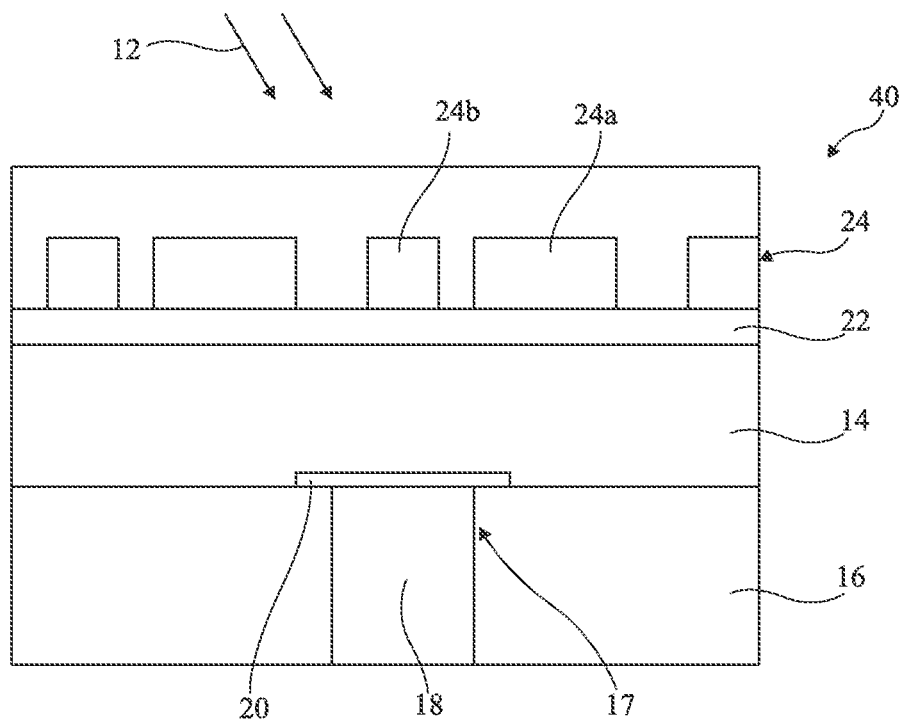
FIG. 2 shows another embodiment of a light sensor.

FIG. 2 shows another embodiment of a light sensor 40.

The sensor 40 comprises the elements of the sensor 10, which will not be described again. The sensor 40 differs from the sensor 10 in the shape of the diffraction grating 24.

The grating 24 in FIG. 2 comprises a superposition of two diffraction gratings. The two gratings are adapted to operate at the same length of different waves, for example. The two gratings are adapted to operate with radiation having different angles of incidence, for example. The grating 24 thus comprises blocks 24a, forming one of the two diffraction gratings and blocks 24b, forming the other diffraction grating.

The blocks 24a all have the same dimensions, and the distance between each block 24a and the nearest neighboring block 24a is substantially the same. Preferably, the grating period of formed by the blocks 24a (i.e., the sum of the width of a block 24a and the distance between each block 24a and the nearest neighboring block 24a) is substantially equal to the operating wavelength in the material of the layer 14. Preferably, the blocks 24a are made of a material that does not absorb radiation at said operating wavelength.

Similarly, the blocks 24b all have the same dimensions and the distance between each block 24b and the nearest neighboring block 24b is substantially the same. Preferably, the grating period formed by the blocks 24b (i.e., the sum of the width of a block 24b and the distance between each block 24b and the nearest neighboring block 24b) is substantially equal to the operating wavelength. Preferably, the blocks 24a are made of a material that does not absorb radiation at said other operating wavelength in the material of the layer 14. Preferably, the blocks 24a and 24b are of the same material, said material not absorbing radiation at the operating wavelengths of both gratings. The grating 24 (i.e., the two sets of blocks 24a and 24b) is preferably periodic, with each period comprising one block 24a and one block 24b.

For example, at least one of the dimensions of blocks 24a is different from the equivalent dimension of blocks 24b.

Figure 3:
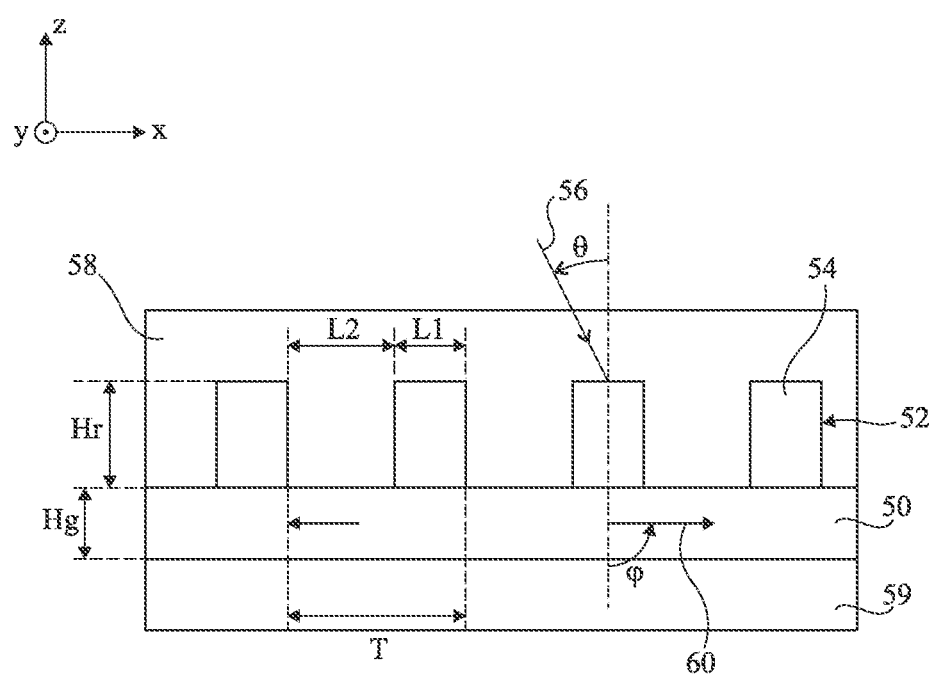
FIG. 3 schematically illustrates the operation of the embodiments of FIGS. 1 and 2.

FIG. 3 schematically illustrates the operation of the embodiments of FIG. 1. FIG. 3 further illustrates the determination of various features of the sensor 10.

FIG. 3 shows a waveguide 50, the operation of which is considered identical to the operation of the layer 14, and a diffraction grating 52, the operation of which is considered identical to the operation of the diffraction grating 24.

The waveguide 50 has a thickness Hg. The thickness of the waveguide corresponds to the dimension along a vertical axis Z of the layer 14 (i.e., the dimension of the layer 14 between the side in contact with the substrate 16 and the side in contact with the layer 22). The width of the waveguide, corresponding to a dimension along a horizontal axis X of the layer 14 (i.e., a dimension in a plane parallel to the upper face or the lower face of the layer 14) is theoretically infinite, for example. The X axis is orthogonal to the Z axis. The width preferably corresponds to the horizontal dimension in the plane of FIGS. 1 to 3. The length of the waveguide (i.e., the dimension of the waveguide along a Y-axis orthogonal to the X- and Z-axes) is considered infinite, for example.

The diffraction grating comprises blocks 54 that are identical to each other in this example. Each block 54 has a thickness Hr. The thickness of a block corresponds to the dimension of the block along a vertical axis Z. Each block 54 in this example is separated from neighboring blocks by the same distance. The diffraction grating, and more precisely the location of the blocks 54, is therefore periodic, with a period T. The width of each block 54 has a value L1. The distance between two neighboring blocks 54, along the X axis, has a value L2. The length of the blocks 54 (i.e., the dimension along the Y axis) is considered infinite. The period T of the diffraction grating is equal to the sum of the values L1 and L2 (i.e., the width of a block 54 and the distance between the blocks 54).

The light rays reaching the diffraction grating (i.e., the incident rays) are shown by an arrow 56. The incident rays reach the diffraction grating at an angle θ to the Z axis. The incident rays have a wavelength λ, where the wavelength λ is an operating wavelength of the sensor 10 or 40 (i.e., a wavelength equal to a value λ0 or within a wavelength range of between λ01 and λ02).

The diffraction grating 52 and the face of the waveguide 50 closest to the incident rays are coated with a material 58, having an optical index n58. The face of the waveguide 50 opposite the face closest to the incident rays is coated with a material 59, having an optical index n59. The material of the blocks 54 of the grating 52 has an optical index n54. The material of the waveguide 50 has an optical index n50.

The guided rays (i.e., the rays obtained by coupling the incident rays 56 diffracted by the grating 52) are shown by arrows 60. The guided rays 60 form an angle φ with the Z axis.

In the embodiments of FIGS. 1 and 2, the different dimensions and materials of the waveguide and the diffraction grating are chosen so as to increase the quantity of diffracted rays moving in a plane contained in the waveguide (i.e., a plane parallel to the top and bottom faces of the waveguide). In other words, the various dimensions and materials of the waveguide and the diffraction grating are chosen so that the angle φ is equal to 90° or −90°.

Determination of the features of the diffraction grating and the waveguide is performed by calculating the effective index neff of the diffracted rays. The effective neff index of the diffracted rays can be calculated by a first method, corresponding in this example to the following coupling equation:

$$neff = n58 * \sin(\theta) - m * \frac{\lambda}{T} * \sin(\varphi)$$

where n58 is the optical index of the material 58, θ is the angle of incidence of the rays 56 in relation to the Z axis, m is an integer, T is the grating period, λ is the wavelength of the incident rays, φ is the desired value of the angle of the guided rays in relation to the Z axis.

The effective index neff can also be calculated by calculating the mode of the guided diffracted ray, by a second method, for example, such as by calculation of the Eigen modes of a multilayer structure. The effective index neff is thus calculated from the thickness Hr of the blocks 54, the thickness Hg of the waveguide, the optical indices n58 of the material 58, n50 of the waveguide and n52 of the grating, and the filling factor f of the grating. Filling factor means the quotient of the width L1 of a block over the period T of the grating (i.e., over the sum of the width L1 of a block 54 and the distance L2 between two neighboring blocks).

For example, a case is considered in which the incident rays received are predominantly rays traveling along the Z axis, i.e. rays whose angle θ is equal to 0°. For example, incident rays with a wavelength λ equal to 940 nm are chosen. In other words, the light sensor 10 or 40 of FIGS. 1 and 2 is configured to generate charges when a light ray having a wavelength substantially equal to 940 nm is in contact with the layer material 14. A value m equal to 1 is arbitrarily chosen. The effective index neff is thus equal to:

$$neff = \frac{\lambda}{T}$$

On the other hand, the thicknesses Hr and Hg of the blocks 54 and of the waveguide 50 equal to 60 nm are chosen, for example. On the other hand, the material 58 is considered to be air and therefore the index n58 is equal to 1, and the blocks 54 and the waveguide 50 are considered made of a quantum film type material and therefore have an optical index equal to 2.43. A filling factor f equal to 50% is also chosen.

The value of the index neff is determined. In the example considered, the effective index neff has the value 1.63. Then, the period T is calculated, that allows guided rays moving in a plane contained in the waveguide to be obtained, with this period T being equal to 401 nm in this example. The period T is thus substantially equal to the wavelength in the quantum film (387 nm) of rays having a wavelength of 940 nm in air.

Various optimization algorithms can be used to determine the features of the light sensor based on criteria chosen by the manufacturer. The optimization algorithm is a particle swarm optimization algorithm, a genetic algorithm or a so-called Monte Carlo algorithm, for example.

An advantage of the described embodiments is that it is possible to increase the absorption of light radiation and thus improve the sensitivity of the light sensors.

Another advantage of the described embodiments is that, for the same absorption rate, it is possible to decrease the thickness of the absorbing layer, and thus decrease the thickness of the sensor.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. An image sensor, comprising:
a first layer made of photoelectric material; and
a diffraction grating located between said first layer and a face of the image sensor configured to receive light rays;
wherein said diffraction grating is configured to diffract the received light rays to produce guided rays which move within the first layer, for a given wavelength, in a plane optimized parallel to top and bottom surfaces of the first layer such that the guided rays are entirely contained within the first layer.

2. The sensor according to claim 1, wherein the diffraction grating has a periodic shape.

3. The sensor according to claim 1, wherein the diffraction grating comprises a plurality of first blocks.

4. The sensor according to claim 3, wherein the first blocks are identical to each other.

5. The sensor according to claim 3, wherein the diffraction grating comprises a plurality of second blocks, each second block having at least one dimension different from each first block.

6. The sensor according to claim 1, wherein the diffraction grating and the first layer are separated by a first conductive electrode.

7. The sensor according to claim 6, wherein the first conductive electrode is a second conductive layer entirely covering the first layer.

8. The sensor according to claim 1, comprising second electrodes in contact with the first layer on a side opposite the diffraction grating.

9. The sensor according to claim 8, comprising a substrate on which the first layer rests.

10. The sensor according to claim 9, wherein each second electrode comprises a conductive region located in the substrate.

11. The sensor according to claim 10, wherein each second electrode comprises a third conductive layer resting on one of the conductive regions and rests partially on the substrate.

12. The sensor according to claim 1, wherein the first layer has a first optical index, wherein the diffraction grating has a second optical index, wherein the first layer has first dimensions, and wherein the diffraction grating has second dimensions, the first and second optical indices and the first and second dimensions selected to control the diffracted light rays to lie in said plane entirely contained within the first layer.

13. The sensor according to claim 12, wherein the first dimensions are a thickness, and wherein the second dimensions are a thickness and filling factor of blocks forming the diffraction grating.

14. An image sensor, comprising:
a waveguide made of photoelectric material configured to generate charges in response to absorption of guided light rays at an operating wavelength;
a first electrode at a top surface of the waveguide;
a second electrode at a bottom surface of the waveguide configured to transmit the charges generated by the photoelectric material of the waveguide;
a diffraction grating located between said first electrode and a face of the image sensor configured to receive light rays at the operating wavelength;
wherein the diffraction grating is configured to diffract the received light rays to produce the guided light rays at the operating wavelength moving inside the waveguide in a direction optimized to be parallel to the top and bottom surfaces of the waveguide.

15. The sensor according to claim 14, wherein the diffraction grating has a periodic shape.

16. The sensor according to claim 14, wherein the diffraction grating comprises a plurality of first blocks.

17. The sensor according to claim 16, wherein the first blocks are identical to each other.

18. The sensor according to claim 16, wherein the diffraction grating comprises a plurality of second blocks, each second block having at least one dimension different from each first block.

* * * * *